US008664806B2

(12) United States Patent
Conil et al.

(10) Patent No.: US 8,664,806 B2
(45) Date of Patent: Mar. 4, 2014

(54) COMMUNICATION BUS AND ELECTRIC PANEL COMPRISING SAID BUS

(75) Inventors: Jean Pierre Conil, Jarrie (FR); Victor Cruchet, Grenoble (FR); Louis Linares, Pontcharra (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 2322 days.

(21) Appl. No.: 11/473,243

(22) Filed: Jun. 23, 2006

(65) Prior Publication Data

US 2007/0073946 A1 Mar. 29, 2007

(30) Foreign Application Priority Data

Jun. 24, 2005 (FR) .................................... 05 06459

(51) Int. Cl.
*G06F 13/00* (2006.01)
(52) U.S. Cl.
USPC ......................................................... 307/149
(58) Field of Classification Search
USPC ......................................................... 307/147
See application file for complete search history.

(56) References Cited

U.S. PATENT DOCUMENTS

| 5,675,467 A * | 10/1997 | Nishimura et al. ........... 307/147 |
| 5,986,893 A * | 11/1999 | Leigh et al. ................... 361/777 |
| 6,365,839 B1 * | 4/2002 | Robbins et al. ............... 174/255 |
| 2004/0257731 A1 | 12/2004 | Legaud |

* cited by examiner

*Primary Examiner* — Fritz M Fleming
(74) *Attorney, Agent, or Firm* — Steptoe & Johnson LLP (57) ABSTRACT

Communication bus having at least one pair of communication lines designed to be connected in series respectively to conductors of a main communication bus designed to be connected to communicating devices of at least one electric panel. Said communication bus comprises at least two branched outputs each having at least two branch lines, said branch lines respectively having a first end connected to a communication line and having a second end designed for connection of the communicating devices. The communication lines are etched on a first conducting layer of a printed circuit, and the branch lines are etched on a second conducting layer of said printed circuit. The communication lines are separated from one another by a distance.

16 Claims, 8 Drawing Sheets

Fig. 1 (State of the art)

COMMUNICATION BUS AND ELECTRIC PANEL COMPRISING SAID BUS

BACKGROUND OF THE INVENTION

The invention relates to a communication bus having at least one pair of communication lines designed to be connected in series respectively to conductors of a main communication bus designed to be connected to the communicating devices of at least one electric panel. Said communication bus comprises at least two branched outputs each having at least two branch lines. Said branch lines respectively have a first end connected to a communication line and have a second end designed for connection of the communicating devices.

STATE OF THE ART

Figure 1:
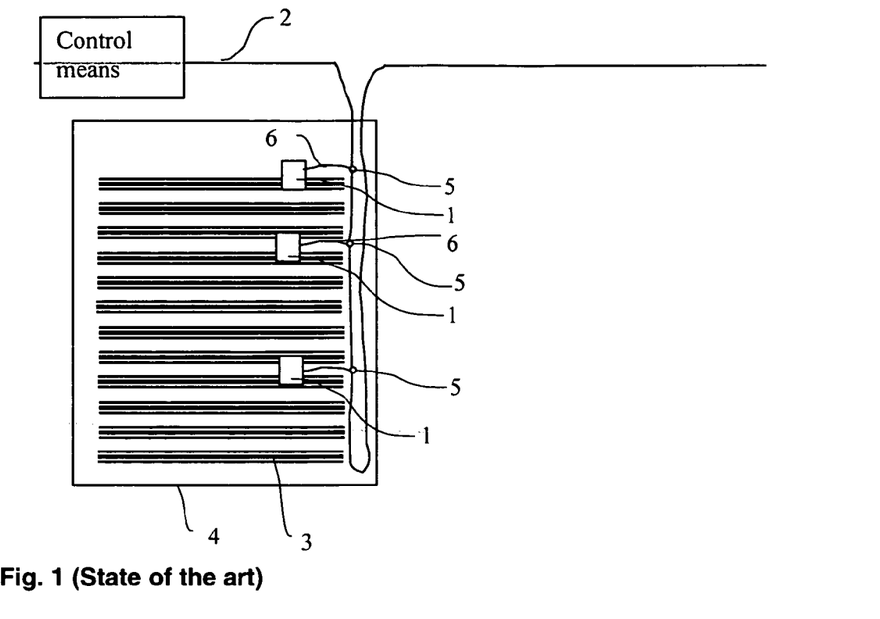
FIG. 1 represents a schematic view of an installation of known type comprising at least one electric panel having communicating devices connected to a communication bus.

The use of communicating devices 1 in electric panels 4 is increasingly commonplace. When these communicating devices 1 are associated with other apparatuses fitted in an electric panel 4, in particular switchgear apparatuses, these communicating devices provide for example information relating to the operating states of said apparatuses.

As represented in FIG. 1, the communicating devices 1 are branch connected to a main communication bus 2 itself connected to data processing means 7. The main communication bus 2 is generally in the form of a shielded cable having at least one twisted pair of conductors.

Several families of electric panels exist each comprising means for fixing the electric apparatuses.

In certain panels of this kind, the apparatuses and communicating devices are arranged on mounting plates or in racks, which are fixed onto the vertical uprights of the panels by fixing means staggered uniformly over the whole height of the panels. The fixing means are arranged regularly with a regular pitch forming the elementary pitch of the panel. The apparatuses and communicating devices of a functional unit are pre-fitted on a mounting plate or in a rack. This pre-fitting is performed outside the panel. The mounting plates or racks are then fitted in the panel via the fixing means. The communicating device or devices are then branch connected to the main branching bus via a branch line.

In certain smaller panels such as switch boxes, the communicating devices 1 are fitted on horizontal fixing rails 3 fixed onto the vertical uprights. Fixing means staggered uniformly over the whole height of the side walls of the electric panels 4 enable the fixing rails 3 to be fixed in parallel manner. The fixing means are arranged regularly with a regular pitch forming the elementary pitch of the panel. The distances separating the fixing rails are equal either to that of an elementary pitch of the panel or to a multiple of said elementary pitch.

In other types of controller panels, the electric apparatuses and communicating devices of all the functional units are placed on a single mounting plate fitted beforehand in the electric panel.

In general manner, when installation is completed, the communicating devices 1 are staggered over the whole height of the electric panel 4 and have to be connected to the main communication bus 2.

The electrical fitter has to branch connect all the communicating devices 1 to branched outputs 5 of the main communication bus 2. Each communicating device 1 is connected to the branched outputs 5 via a branch line 6. The branch line 6 is connected to a twisted pair(s) shielded cable of the main communication bus 2 by a branch connector. The twisted pair(s) shielded cable of the main communication bus 2 preferably runs back and forth over the whole height of the electric panel.

In practice, the fitter will have to fit a branch connector on the twisted pair(s) shielded cable, on each branched output 5. This operation is relatively long and tedious.

Moreover, inserting branch connectors along the cable is liable to modify the characteristic impedance $Z0$ of the latter. These modifications of characteristic impedance $Z0$ may be responsible for data losses among the data transmitted or received. A slowing-down of the transmission rate of said data can also be observed.

Furthermore, when the number of branch lines 6 connected to the branched outputs 5 is too large with respect to the length of the main communication bus 2, a detrimental variation of the characteristic impedance of the communication bus can also be observed. The acceptable sum of the lengths of the branch lines is proportional to the total length of the communication bus. In practice, when a large number of branch lines are to be used, the main communication bus has to be lengthened accordingly.

To minimize these shortcomings of unsuitability of the main communication bus, the fitter may have to limit the number of branched outputs 5 in a panel 4. In practice, the branch pitch p generally observed in electric installations is greater than 12 cm. This branch pitch p is generally larger than the elementary pitch separating fixing means of the rails, mounting plates or racks. Thus, each branched output 5 is not necessarily facing a communicating device 1. The positioning of a branch line 6 connecting a communicating device 1 to a branched output 5 becomes more complex to achieve.

The main communication bus 2 also generally comprises two conductors for electric power supply of the communicating devices. These supply conductors are integrated in the twisted pair(s) shielded cable. On account of the length of the main communication bus 2, a significant voltage drop can be observed at the end of the bus.

At the time an installation is designed, the electrical fitter may have to make a compromise between the total length of the branch lines 6 and the voltage drop acceptable over the length of said bus.

Either the fitter gives priority to the number of branched outputs 5 to the detriment of maintaining the voltage along the communication bus 10. In fact, the greater the total length of branch lines 6, the longer the communication bus and the more significant the voltage drop observed at the end of the main communication bus.

Or the fitter minimizes the voltage drop along the communication bus and limits the number of branch lines 6 to be installed.

SUMMARY OF THE INVENTION

The object of the invention is therefore to remedy the drawbacks of the state of the technique, so as to propose a communication bus comprising a large number of branched outputs while limiting the voltage drop observed at the end of the communication bus.

The communication lines according to an embodiment of the invention are etched on a first conducting layer of a printed circuit, and the branch lines are etched on a second conducting layer of said printed circuit. The communication lines are separated from one another by a distance comprised between 1 mm and 15 mm, the cross-section of each communication line being greater than $0.1\ mm^2$, the cross-section of each branch line being greater than 0.01 mm². The first and second conducting layers are separated by a distance of more than 1.4 mm Advantageously the communication lines have a width comprised between 1 mm and 6 mm and a thickness comprised between 30 μm and 110 μm. The branch lines have a width comprised between 0.2 mm and 3 mm and a thickness comprised between 30 μm and 110 μm, the branch lines being separated from one another by a distance comprised between 1 mm and 15 mm.

According to a development of the invention, at least one ground conductor is connected to each branched output respectively by a ground line.

According to a development of the invention, the communication bus comprises two electric power supply conductors for supply of the communicating devices.

Preferably, the two electric power supply conductors are designed to be branch connected to a main power supply line connecting one or more electric panels to a main power supply source.

In one embodiment of the invention, the communication lines comprise a first outgoing section and a second incoming section, the first and second sections extending in parallel manner over the length of the bus and being connected in series via one of their ends.

Advantageously, the branch lines are connected alternately to the outgoing sections and to the incoming sections.

Advantageously, the branch lines are perpendicular to the communication lines.

In a particular embodiment, the printed circuit comprises at one end thereof, connection means designed to abut said bus to a second communication bus.

Advantageously, the connection means are able to connect the communication lines of a first bus and of a second bus so as to form a winding of said lines, the winding pitch of the communication lines corresponding substantially to the length of the printed circuit of a communication bus.

In a particular embodiment, the printed circuit is surrounded by a metal shielding over the whole length of the communication bus or of the abutted communication busses.

Advantageously, the metal shielding is electrically connected to the ground conductor of the printed circuit and comprises fixing means designed to fix its mechanical structure to an electric panel and to connect the shielding electrically to the ground of the electric panel.

Preferably, the characteristic impedance of the communication bus is comprised between 100 and 150Ω.

Preferably, the branching pitch between two branched outputs is smaller than or equal to 50 millimetres.

Advantageously, the second ends of the branch lines form, with the edge of the printed circuit, the imprints designed to receive electric connectors of communicating devices.

Advantageously, the communication lines are not straight and respectively comprise local deformations along said lines.

Advantageously, the local deformations are formed by chicanes comprising at least two linear conducting sections.

Advantageously, the communication lines respectively comprise at least one joining connector designed to serially connect a section of twisted pair(s) shielded cable.

An electric panel comprises fixing means designed to secure fixing rails or mounting plates for fitting communicating devices, the fixing means being uniformly staggered with an elementary pitch over the height of said panel. The electric panel comprises at least one communication bus as defined above, the branched outputs of the communication bus being uniformly staggered with a pitch equal to a multiple of the elementary pitch of the panel.

Advantageously, the branched outputs of the communication bus are uniformly staggered with a regular pitch substantially equal to the elementary pitch of the panel.

Preferably, the communication bus is positioned in such a way that each rail or mounting plate is facing a branched output.

BRIEF DESCRIPTION OF THE DRAWINGS

Other advantages and features will become more clearly apparent from the following description of a particular embodiment of the invention, given as a non-restrictive example only, and represented in the accompanying drawings, in which.

DETAILED DESCRIPTION OF AN EMBODIMENT

Figure 2:
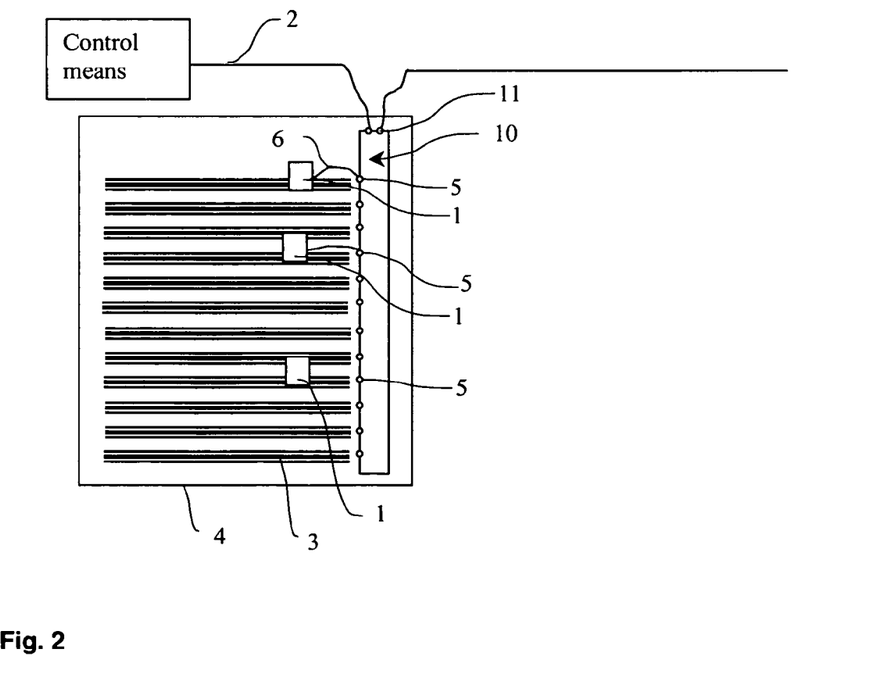
FIG. 2 represents a schematic view of an installation comprising at least one electric panel comprising a communication bus according to the different embodiments of the invention.

The communication bus 10 according to embodiments of the invention is preferably designed to be installed permanently fixed and in independent manner in an electric panel 4. The communication bus 10 then comprises connection means 11 for serial connection of a pair of communication lines D+, D− to the lines of a main communication bus 2. The lines preferably have the same characteristic impedance. The main communication bus 2 connects one or more electric panels 4 to data processing means. Generally, the main communication bus 2 is in the form of a twisted pair(s) shielded cable.

Figure 3:
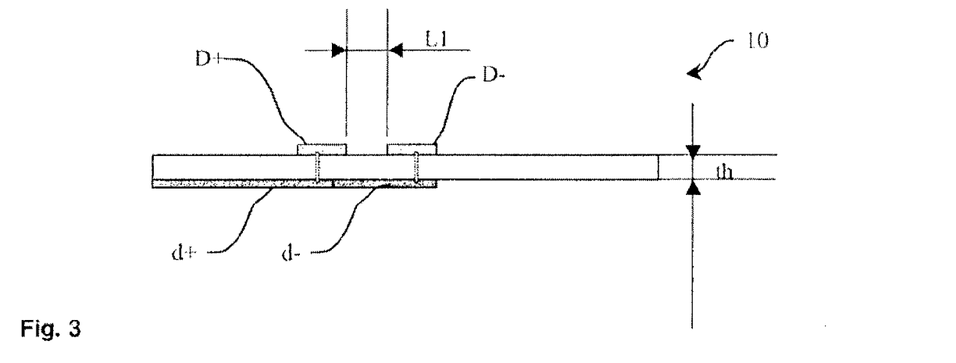
FIG. 3 represents a schematic cross-sectional view of a communication bus according to a first embodiment of the invention.
Figure 4:
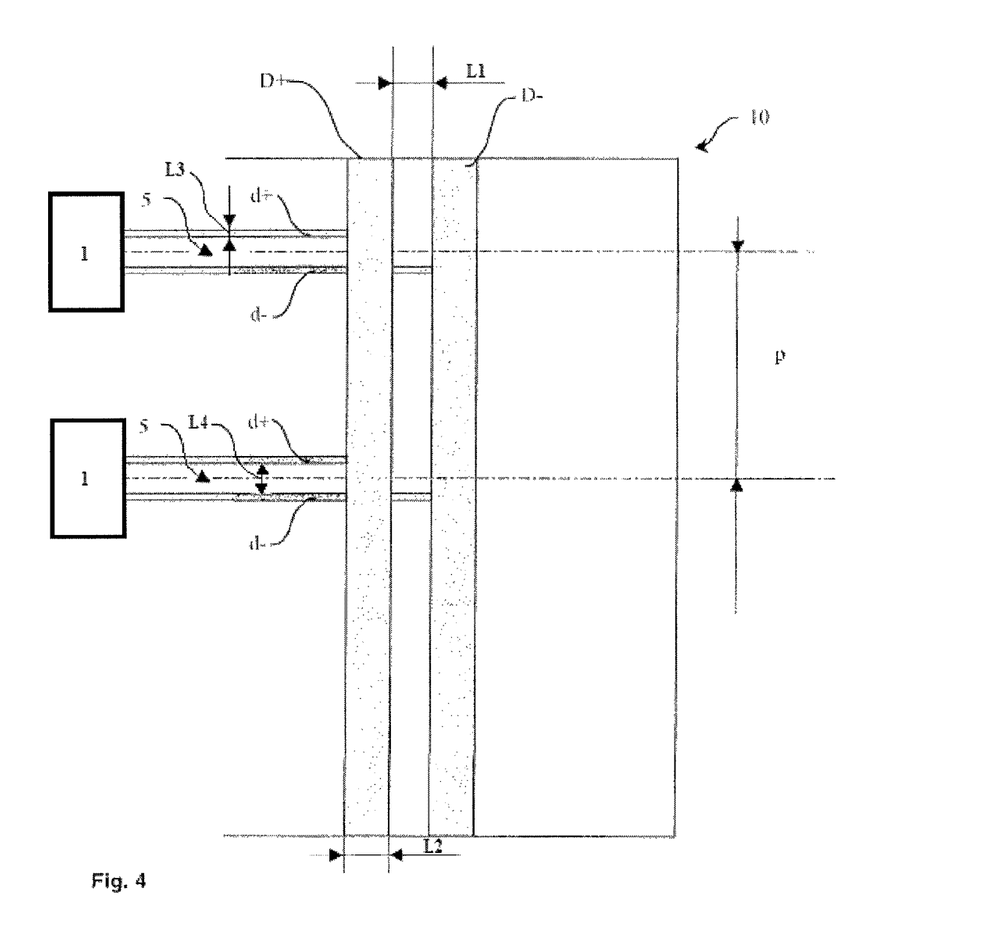
FIG. 4 represents a top view of a communication bus according to FIG. 3.

According to a first preferred embodiment of the invention, represented in FIGS. 3 and 4, the communication bus 10 comprises an elongate support composed of a printed circuit having at least two conducting layers.

A pair of communication lines D+, D− is achieved by etching on a first layer. As represented in FIG. 4, the communication bus 10 comprises at least two branched outputs 5 each having at least two branch lines d+, d−. The branch lines d+, d− have two ends. A first end is connected to the communication lines D+, D−. A second end is designed for connection of the communicating devices. The branch lines d+, d− are etched on a second conducting layer of said printed circuit.

The communication lines D+, D− are designed to be connected in series respectively to conductors of a twisted pair of a shielded cable of a main communication bus, advantageously having the same characteristic impedance Z0. Connection means 11 enable electrical connection to be made between the communication bus 10 and the main communication bus 2.

In the embodiment described, the thickness of each conducting layer of the printed circuit is comprised between 30 and 110 μm, preferably between 35 and 105 μm. The first and second conducting layers are separated by a distance th greater than 1.4 mm. The distance th is for example equal to 1.6 mm. This dimension corresponds to the thickness of a standard printed circuit.

For the communication bus to have a characteristic impedance comprised between 100 and 150 Ohms over the whole length of the printed circuit, the communication lines D+, D− are separated from one another by a distance L1 comprised between 1 mm and 15 mm. In addition, the cross-section of each communication line D+, D− is greater than 0.1 $mm^2$. Finally, the cross-section of each branch line d+, d− is greater than 0.01 $mm^2$.

In the embodiment, the branch lines d+, d− are perpendicular to the communication lines D+, D−. The branching pitch p between two branched outputs 5 is smaller than or equal to 50 millimetres. The communication lines D+, D− have a width L2 between 1 mm and 6 mm. The branch lines d+, d− have a width L3 of between 0.2 mm and 3 mm. The branch lines d+, d− are separated from one another by a distance L4 of between 1 mm and 15 mm. The characteristic impedance Z0 of the communication bus is between 100 and 150Ω.

Considering the positioning of the branch lines d+, d− on the printed circuit, the second ends of said lines form with the edge of the printed circuit the imprints designed to receive branch electric connectors. Said insertable electric connectors 30 enable the branch lines 6 of the communicating devices 1 to be connected to the communication bus 10.

Figure 5:
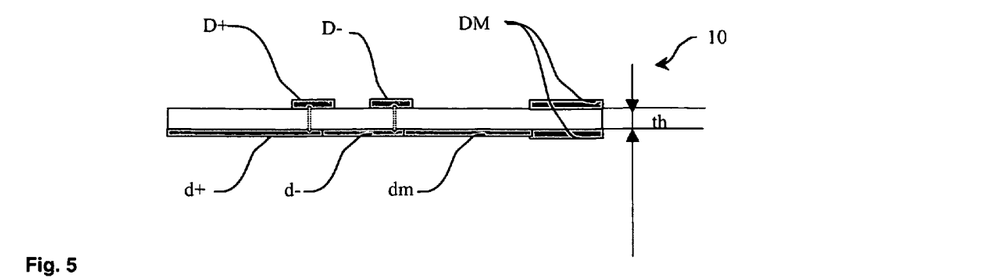
FIG. 5 represents a schematic cross-sectional view of a communication bus according to a second embodiment of the invention.
Figure 6:
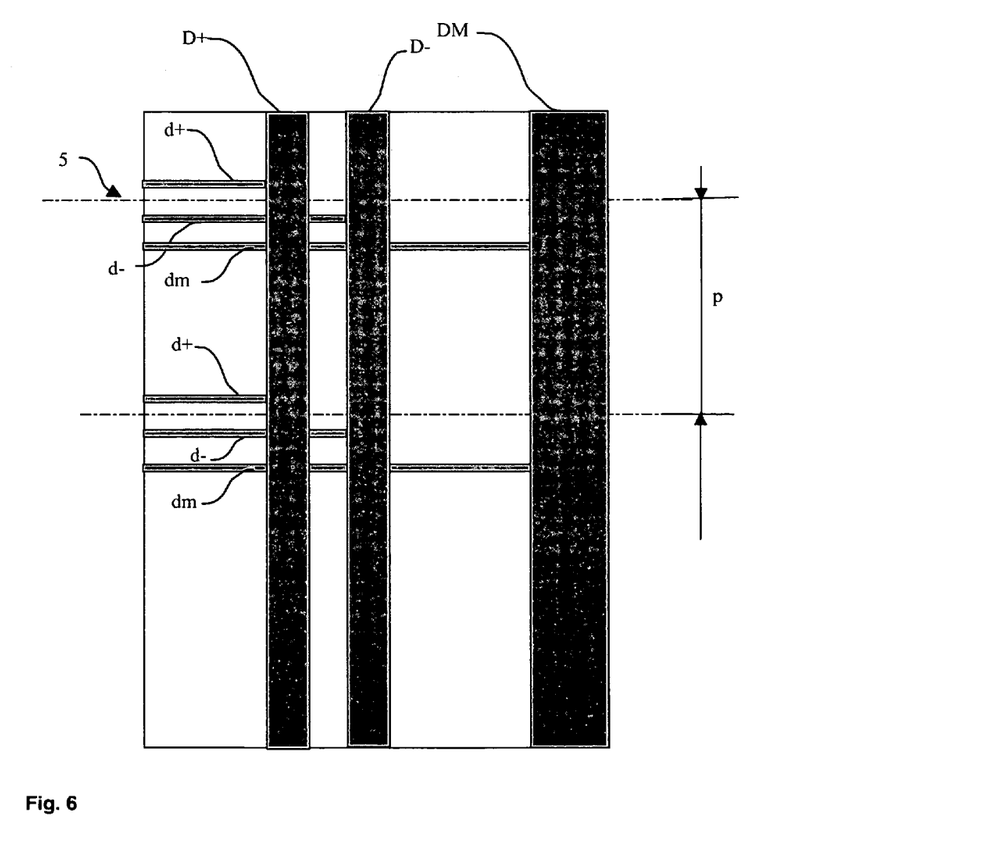
FIG. 6 represents a top view of a communication bus according to FIG. 5.

As represented in FIGS. 5 and 6, the communication bus 10 according to a second preferred embodiment of the invention comprises at least one ground conductor DM. Said conductor is arranged in parallel with the other two communication lines d+, d−. The ground conductor DM is connected to each branched output 5 respectively by a ground line dm. The ground line dm is preferably placed perpendicularly to the ground conductor DM. The ground line dm is etched on the second conducting layer of the printed circuit, parallel to the branch lines d+, d−.

Figure 7:
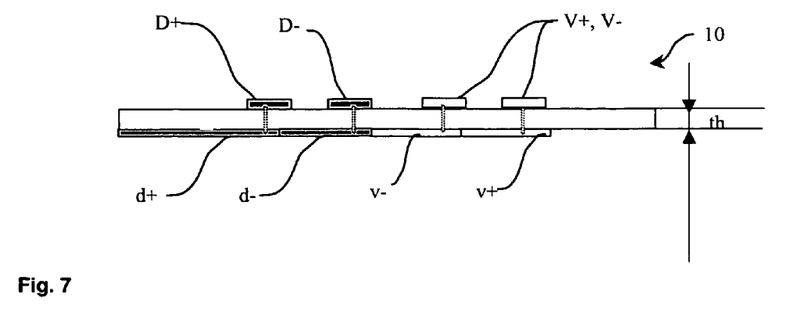
FIG. 7 represents a schematic cross-sectional view of a communication bus according to a third embodiment of the invention.
Figure 8:
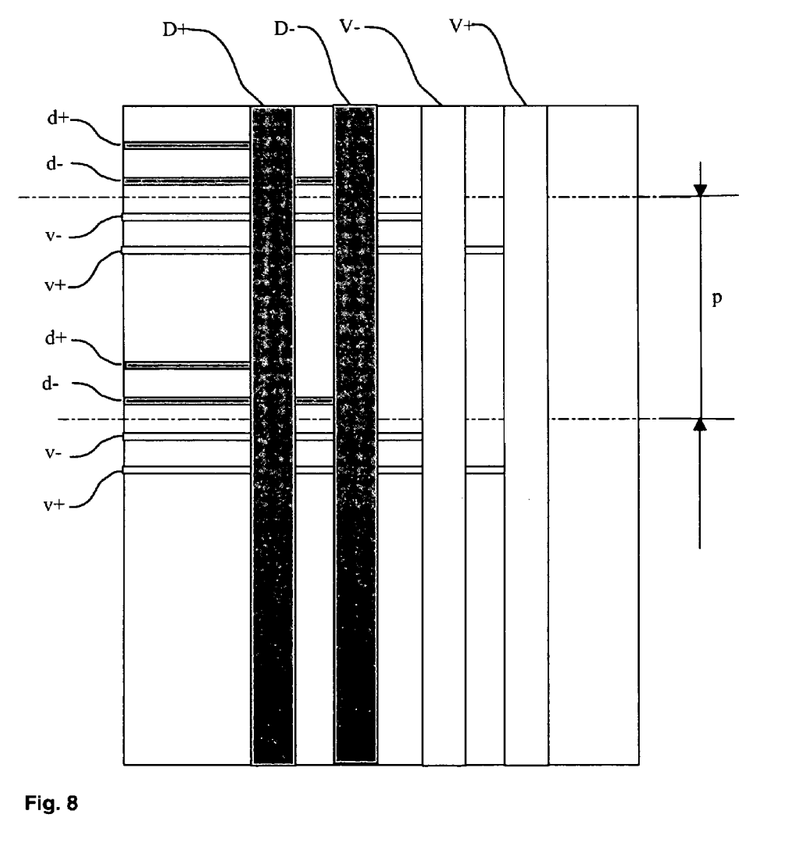
FIG. 8 represents a top view of a communication bus according to FIG. 7.

As represented in FIGS. 7 and 8, the communication bus according to a third preferred embodiment of the invention comprises two electric power supply conductors V+, V− designed for power supply of the communicating devices 1. Said conductors are arranged parallel to the two communication lines d+, d−. The power supply conductors V+, V− are connected to each branched output 5 respectively by power supply lines v+, v−. In addition, the two power supply conductors V+, V− have one of their ends designed to be branch connected to a main power supply line connecting one or more electric panels to a main power supply source. The main power supply line is generally integrated in the twisted pair(s) shielded cable of the main communication bus 2.

In a general manner, the communication lines D+, D− according to the different embodiments of the invention are connected in series with the conductors of the main communication bus 2. Each communication line D+, D− comprises a first end designed to be connected to the main communication bus.

According to a first alternative embodiment, each communication line D+, D− comprises a second end designed to be connected in series to the main communication bus 2 via a twisted pair(s) shielded cable of a length substantially equal to that of the communication bus 10.

Figure 9:
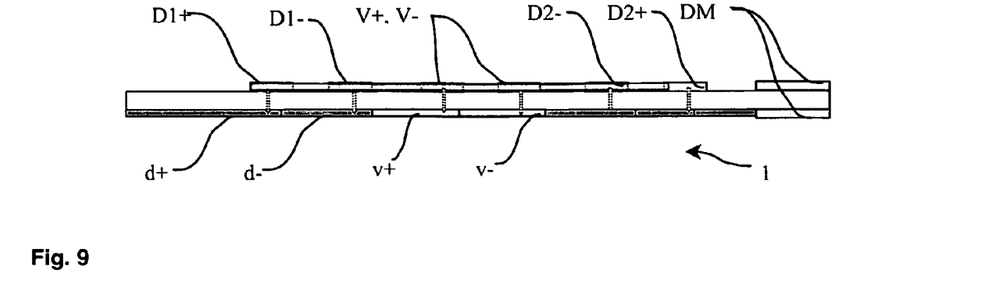
FIG. 9 represents a schematic cross-sectional view of a communication bus according to an alternative embodiment of the different embodiments of the invention.
Figure 10:
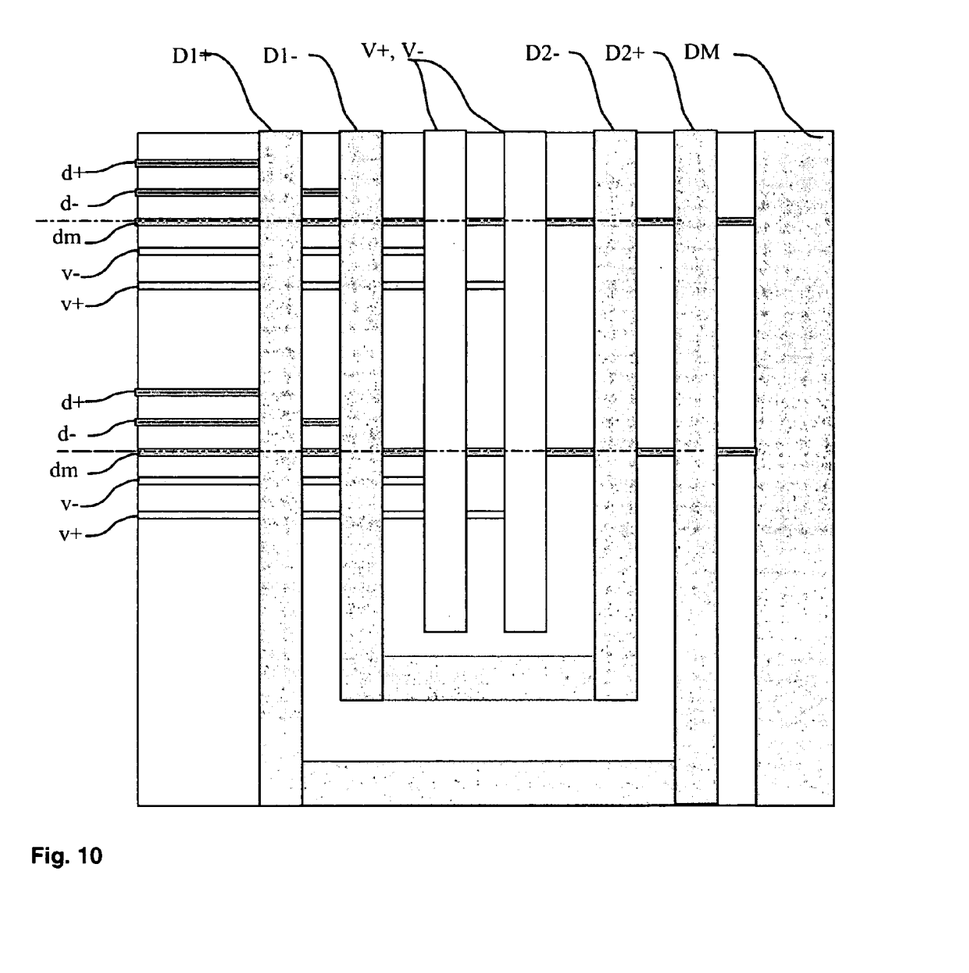
FIG. 10 represents a top view of a communication bus according to FIG. 9.

According to a second alternative embodiment, the communication lines D+, D− of the communication bus are each composed of two sections; a first outgoing section D1+, D1− and a second incoming section D2+, D2−. The outgoing and incoming sections connected in series via one of their ends extend parallel to one another over the length of the printed circuit. The free ends of the outgoing and incoming sections of one and the same communication line are connected in series via connection means to conductors of a main communication bus 2.

According to another alternative embodiment, the branch lines d+, d− are connected alternately to the outgoing sections D1+, D1− and to the incoming sections D2+, D2−. This geographical distribution of the connections enables a better distribution of capacitances caused by the branch lines over the outgoing or incoming sections. This configuration tends to limit impedance mismatching and dispersions between the outgoing section and the incoming section.

The coupling capacitances between the communication lines and the branch lines influence obtaining of the characteristic impedance Z0 of the communication bus. For the coupling capacitances to be equivalent between the branch lines and the outgoing sections on the one hand and between the branch lines and the incoming section on the other hand, the same track length can be envisaged to be used for all the ground lines dm, power supply lines V+, V− and branch lines d+, d−. This universal printed circuit track length corresponds substantially to the width of the printed circuit.

Figure 11:
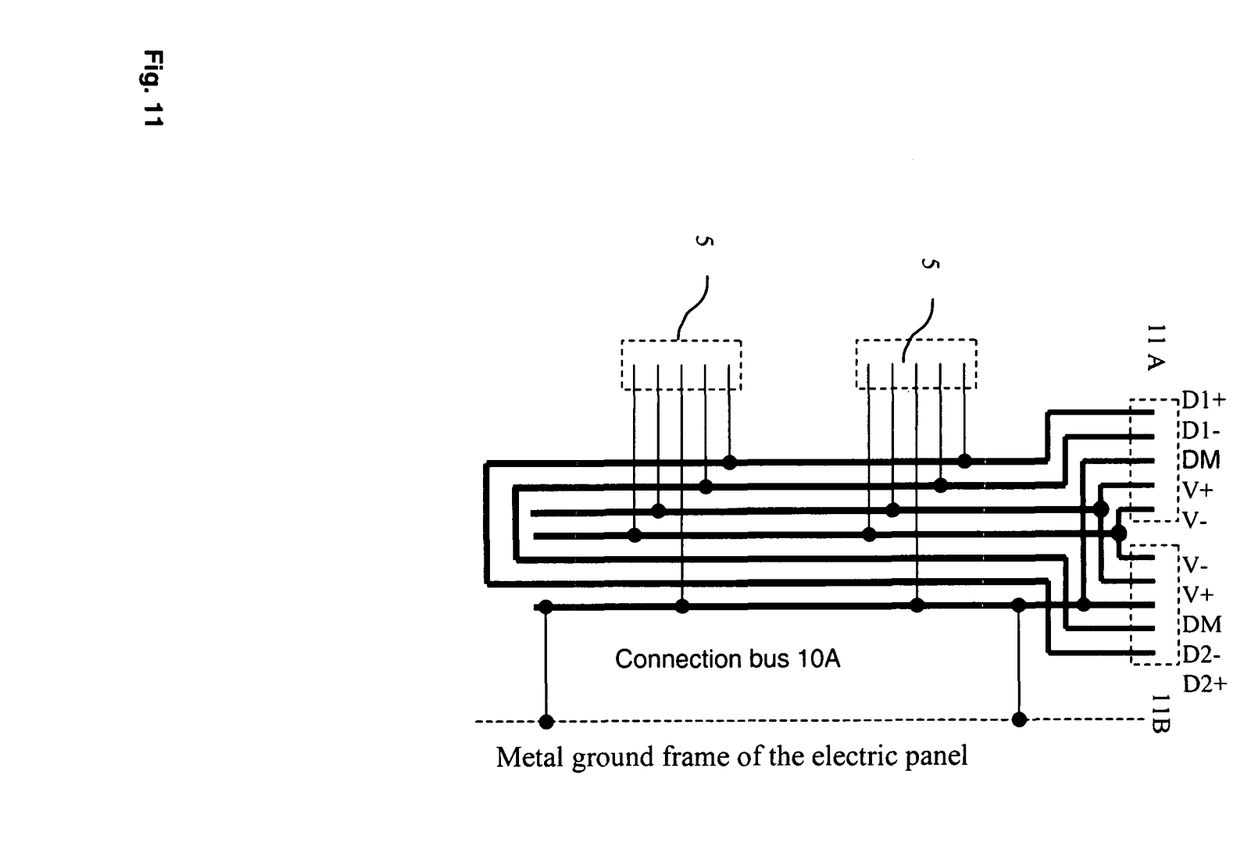
FIG. 11 represents a schematic view of a communication bus according to a fourth embodiment of the invention.

According to a fourth preferred embodiment of the invention, the communication bus 10 comprises known communication lines D+, D−, ground lines and power supply conductors in the three preferred embodiments of the invention. As represented in FIG. 11, the end of the printed circuit that is designed to be connected to the main communication bus 2 on the one hand enables both of the communication lines D+, D− to be connected in series to communication conductors of the main bus 2. On the other hand, the end of the printed circuit enables the two power supply conductors V+, V− to be branch connected to a main power supply line.

Depending on the type of installation and the size of the electric panels 4, the communication bus 10 according to any one of the embodiments of the invention may prove not to be long enough with respect to the height of the panel. The length of the communication bus proportional to that of the printed circuit is directly dependent on standardized printed circuit manufacturing means or techniques. According to the embodiments described, the printed circuits have a maximum length of about sixty centimetres. Thus, the communication busses 10 have a length substantially equal to 0.6 metres. When the electric panels used have a standardized height of about 1.50 to 1.80 metres, several communication busses 10 then have to be used. Said busses then comprise connection means, at one end of the printed circuit, designed to abut a first bus 10 to at least one second communication bus 10.

Figure 12:
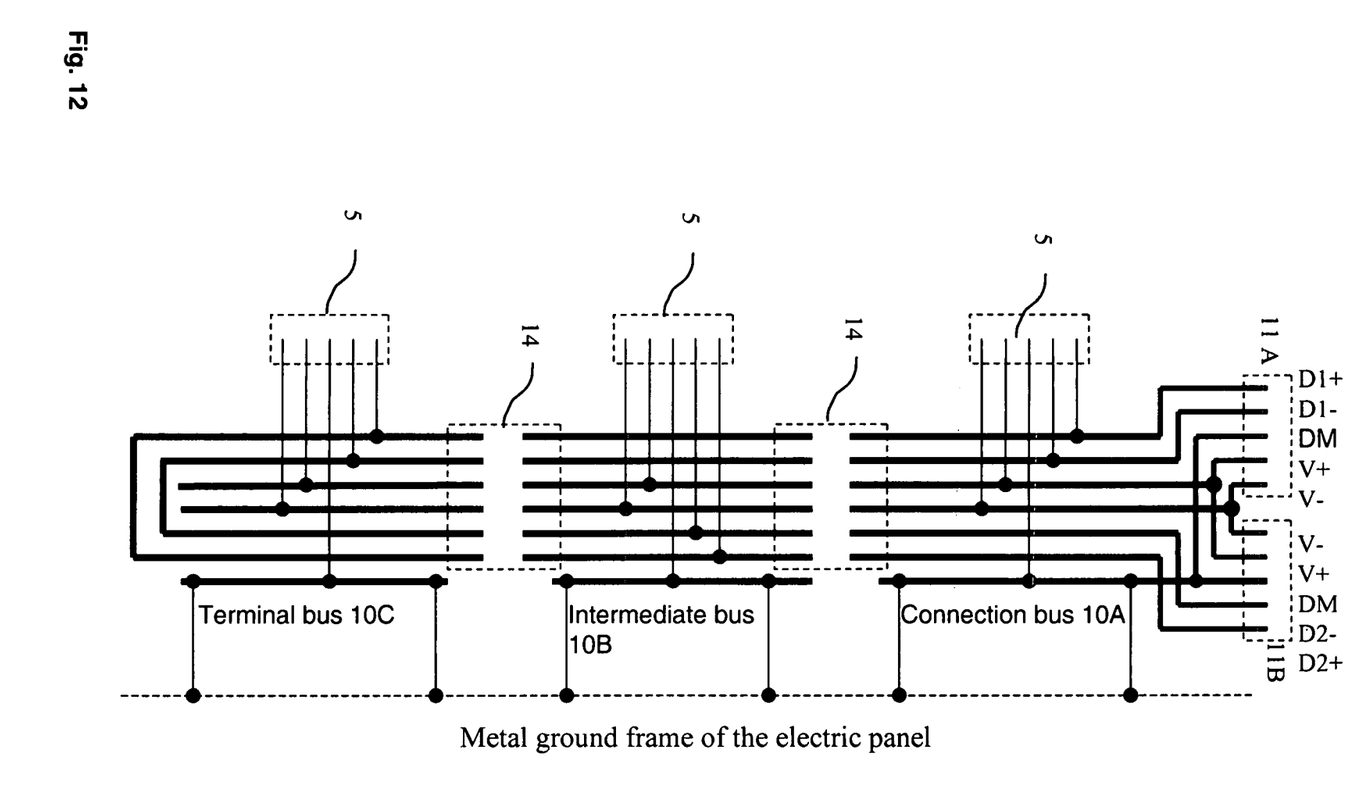
FIG. 12 represents a schematic view of the assembly of three communication busses according to the embodiments of the invention.

As represented in FIG. 12, three communication busses according to the invention are abutted in series. Preferably, the printed circuits of the three communication bus have substantially the same length. The three busses are henceforth respectively called connection bus 10A, intermediate bus 10B and terminal bus 10C. The communication busses 10 are connected to one another by connection means 14. The connection bus 10A is designed to be connected to the conductors of the main communication bus 2 via input and output connection means 11A, 11B. These three communication busses 10 respectively comprise two communication lines each composed of a first outgoing section D1+, D1− and a second incoming section D2+, D2−. In addition, each of the communication busses 10 comprises at least one ground conductor DM connected to each branched output 5 respectively by a ground line dm. Finally, the communication busses comprise two electric power supply conductors V+, V− arranged parallel to the outgoing and incoming sections of the communication lines. The power supply conductors V+, V− are connected to each branched output 5 respectively by power supply lines v+, v−.

It can be envisaged that the connection means 14 between the connection bus 10A, the intermediate bus 10B and the terminal bus 10C be able to connect the communication lines D+, D− of two adjacent busses so as to form a winding of said lines. The winding pitch of the communication lines D+, D− corresponds substantially to the length of a printed circuit of a communication bus 10A, 10B, 10C. This winding enables a twist equivalent to that present in a twisted pair shielded cable to be reconstituted. The role of the twist is to minimize the voltages induced by disturbance electromagnetic fields. The voltage induced in a loop is in fact cancelled by the reverse voltage induced in the next loop.

According to an alternative embodiment of the invention, the printed circuit of the communication bus 10 is surrounded by a metal shielding over the whole length of the communication bus or abutted communication busses. The metal shielding is electrically connected at different points to the ground conductor DM of the printed circuit. Moreover, the shielding comprises fixing means designed to fix its mechanical structure to an electric panel 4 and to electrically connect the shielding to the ground of the electric panel.

To increase the maximum length of branch lines usable on a communication bus according to the different embodiments of the invention, an alternative embodiment consists in increasing the length of the communication lines D+, D− without changing the apparent length of the communication bus 10. Two solutions described below can be implemented either independently or in combination.

Figure 14:
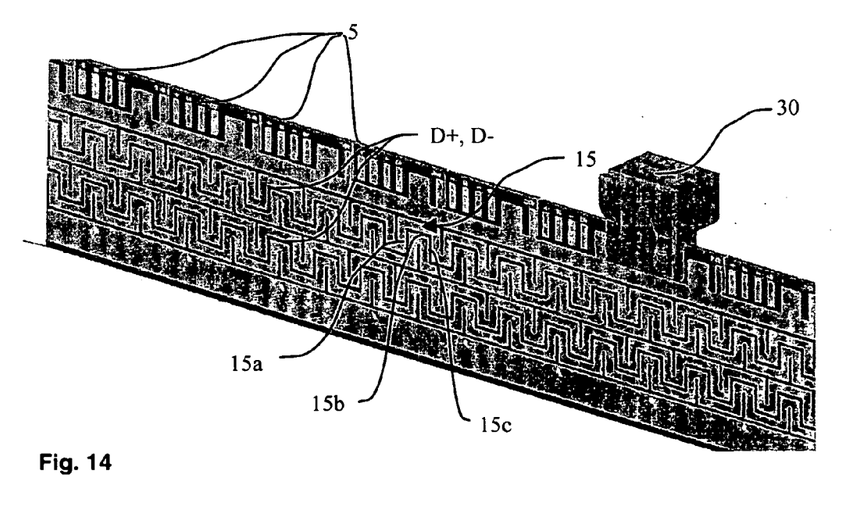

A first solution consists in achieving communication lines D+; D− that are not straight. Each communication line extending over the whole length of the printed circuit comprises a certain number of local deformations. As represented in FIG. 14 for example, the local deformations can take the form of chicanes 15 composed of three linear conducting sections 15a, 15b, 15c. Preferably, the sections 15a, 15b, 15c are joined to one another perpendicularly. The chicanes are staggered linearly and uniformly over the whole length of the communication lines D+, D−. For a given printed circuit length, these chicanes enable the length of each communication line to be approximately doubled. The shape of each local deformation is not limited to that of a three-sided chicane. Local deformations having spiral shapes or circular shapes can be envisaged.

Figure 13:
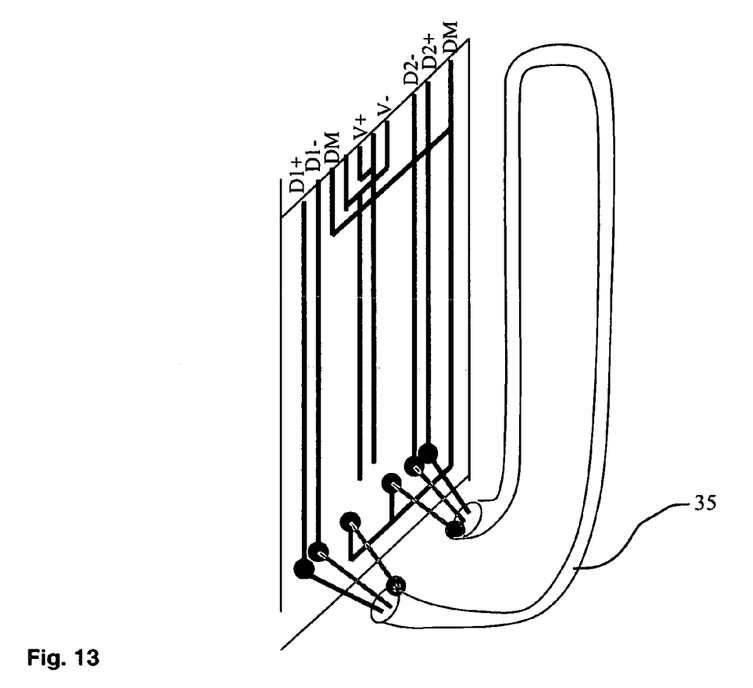
FIGS. 13 and 14 represent schematic views of alternative embodiments of the different embodiments of the invention.

A second solution consists in fitting at least one joining connector designed to connect a section 35 of twisted pair(s) shielded cable in series on the communication lines D+, D−. As represented in FIG. 13, the communication lines are then composed of at least two parts. At least one first conducting part is etched on the printed circuit and forms an integral part of said circuit. At least one second part is formed by a flexible section 35 of twisted pair(s) shielded cable. The total length of the communication lines can thus be lengthened without changing the length of the printed circuit of the communication bus 10. This second solution can comprise several joining connectors able to be used to connect several sections 35 of twisted pair(s) shielded cable in series.

The two solutions can obviously be used in combination to benefit from the advantages of both of them.

Furthermore, the communication bus 10 according to the different embodiments of the invention can be integrated in an electric panel 4. Said electric panel comprises fixing means designed to secure fixing rails 3 or mounting plates. Said rails or mounting plates are designed to receive in particular communicating devices. The fixing means are staggered uniformly by an elementary pitch over the height of said panel. The panel comprises at least one communication bus 10 having branched outputs 5. Said outputs are staggered uniformly with a pitch equal to a multiple of the elementary pitch of the panel. In the embodiment described, the branched outputs 5 of the communication bus 10 are staggered uniformly, preferably with a regular pitch substantially equal to the elementary pitch of the panel. Advantageously, the communication bus 10 is positioned in such a way that each rail or mounting plate 3 is facing a branched output 5.

The invention claimed is:

1. A communication bus having at least one pair of communication lines for connecting in series, respectively, to conductors of a main communication bus for connecting to communicating devices of at least one electric panel, said communication bus comprising at least two branched outputs each having at least two branch lines, said branch lines, respectively, having a first end connected to a communication line, and having a second end designed for connection to a communicating device, wherein:
the communication lines are etched in a first conducting layer of a printed circuit, and the branch lines are etched in a second conducting layer of said printed circuit, wherein a first end of each of the branch lines is connected to a single one of the communication lines, respectively,
the communication lines are separated from one another by a distance between 1 mm and 15 mm, the cross-section of each communication line being greater than 0.1 mm$^2$,
the cross-section of each branch line is greater than 0.01 mm$^2$, and
the first and second conducting layers are separated by a distance greater than 1.4 mm.

2. A communication bus according to claim 1 wherein
the communication lines have a width between 1 mm and 6 mm, and a thickness between 30 μm and 110 μm,
the branch lines have a width between 0.2 mm and 3 mm, and a thickness between 30 μm and 110 μm, the branch lines being separated from one another by a distance between 1 mm and 15 mm.

3. A communication bus according to claim 1 comprising at least one ground conductor connected to each branched output, respectively, by a ground line.

4. A communication bus according to claim 1 comprising two electric power supply conductors for supplying the communicating devices.

5. A communication bus according to claim 4 wherein the two electric power supply conductors are designed to be branch connected to a main power supply line connecting one or more electric panels to a main power supply source.

6. A communication bus according to claim 1 wherein the ends of the communication lines comprises a first outgoing section and a second incoming section, the first and second sections extending in parallel to each other over the length of the bus and being electrically connected in series.

7. A communication bus according to claim 6 wherein the branch lines are connected alternately to the outgoing sections and to the incoming sections.

8. A communication bus according to claim 1 wherein the branch lines are perpendicular to the communication lines.

9. A communication bus according to claim 8 comprising connection means, at one end of the printed circuit, designed to abut said bus to a second communication bus.

10. A communication bus according to claim 9 wherein the connection means are able to connect the communication lines of a first bus and of a second bus to form a winding of said lines, the winding pitch of the communication lines corresponding substantially to the length of the printed circuit of a communication bus.

11. A communication bus according to claim 1 wherein its characteristic impedance is between 100 and 150Ω.

12. A communication bus according to claim 1 wherein a branching pitch between two branched outputs is smaller than or equal to 50 millimeters.

13. A communication bus according to claim 1 wherein the second ends of the branch lines form, with the edge of the printed circuit, imprints designed to receive electric connectors of communicating devices.

14. A communication bus according to claim 1 wherein the communication lines are not straight and comprise staggered local deformations.

15. A communication bus according to claim 14 wherein the local deformations are formed by chicanes comprising at least two linear conducting sections.

16. A communication bus according to claim 1 wherein the communication lines comprise at least one joining connector for connecting a section of twisted pairs of shielded cable in series.

* * * * *